United States Patent [19]

Neumann et al.

[11] Patent Number: 5,852,795
[45] Date of Patent: Dec. 22, 1998

[54] APPARATUS FOR CONTROLLING A MULTIPLICITY OF COMPRESSORS

[75] Inventors: Scott E. Neumann, Clarence; Ewan Choroszylow, East Aurora, both of N.Y.

[73] Assignee: New York Gas Group, New York, N.Y.

[21] Appl. No.: 754,837

[22] Filed: Nov. 22, 1996

[51] Int. Cl.⁶ .................... H04Q 1/00; H04Q 1/18
[52] U.S. Cl. .................. 702/98; 702/45; 702/47; 702/140; 364/139; 364/180
[58] Field of Search ................... 364/138, 139, 364/144, 180, 188, 506, 509, 510, 558; 361/681; 395/556, 559, 500, 821, 823, 834, 842; 702/45, 47, 98, 140

[56] References Cited

U.S. PATENT DOCUMENTS

| | | | |
|---|---|---|---|
| 3,824,597 | 7/1974 | Berg | 370/215 |
| 3,829,597 | 8/1974 | Peterson et al. | 84/635 |
| 4,052,892 | 10/1977 | Browne | 73/149 |
| 4,378,956 | 4/1983 | Lester | 340/815.42 |
| 4,757,443 | 7/1988 | Hecker et al. | 345/10 |
| 5,285,197 | 2/1994 | Schmidt et al. | 345/213 |
| 5,392,288 | 2/1995 | Rudman et al. | 371/2.2 |
| 5,522,798 | 6/1996 | Johnson et al. | 604/65 |
| 5,579,528 | 11/1996 | Register | 364/704 |
| 5,621,678 | 4/1997 | Barnaby et al. | 365/52 |
| 5,634,080 | 5/1997 | Kikinis et al. | 395/893 |
| 5,646,545 | 7/1997 | Trimberger et al. | 326/38 |
| 5,649,125 | 7/1997 | Tietjen et al. | 395/306 |

*Primary Examiner*—Emanuel Todd Voeltz
*Assistant Examiner*—Cuong H. Nguyen
*Attorney, Agent, or Firm*—Howard J. Greenwald

[57] ABSTRACT

A controller comprised of a high speed central processing unit, at least about 32 analog input channels operatively connected to the central processing unit, at least about 48 digital input channels operatively connected to the central processing unit, at least about 32 digital output channels operatively connected to the central processing unit, at least 20 control input channels connected to the central processing unit, and electroluminescent display means for displaying graphical information connected to the central processing unit.

18 Claims, 11 Drawing Sheets

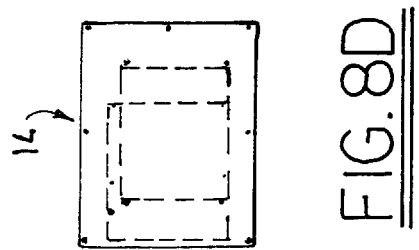
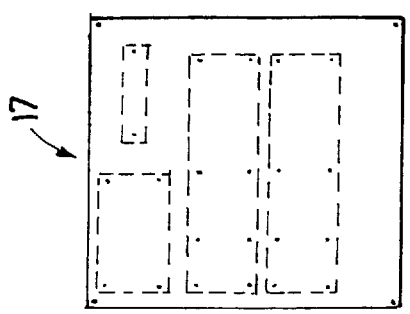
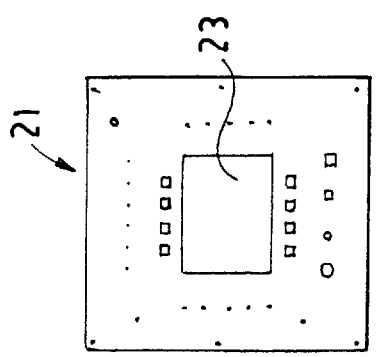
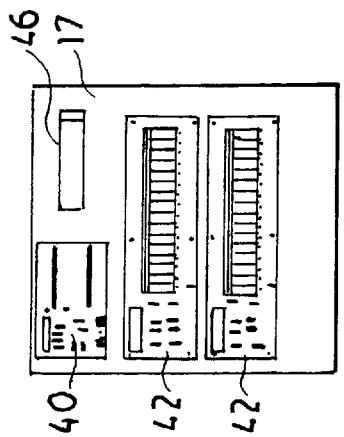
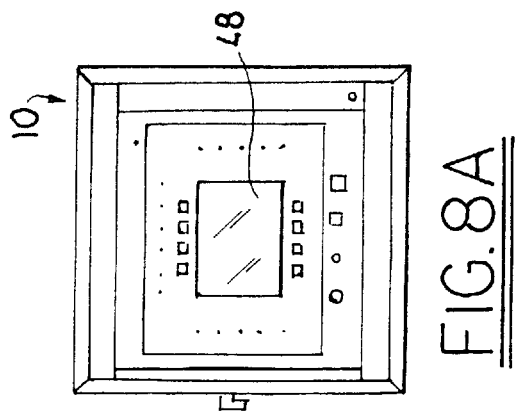
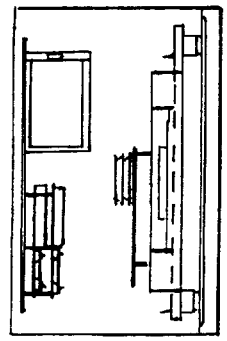

ated by reference herein. Substantially centrally disposed within display 48 is plexiglass window 20.

APPARATUS FOR CONTROLLING A MULTIPLICITY OF COMPRESSORS

FIELD OF THE INVENTION

A controller especially adapted for controlling the flow of fluid such as natural gas.

BACKGROUND OF THE INVENTION

Controllers for metering and transferring liquids and gases are well known to those skilled in the art. By way of illustration, U.S. Pat. No. 5,353,849 discloses an apparatus for metering and transferring a cryogenic liquid (such as liquefied natural gas) from a storage to a vehicle fuel tank. The apparatus of this patent includes a programmable controller, a motor-driven pump, and a network of conduits with motor-operated valves and liquid sensors.

The prior art controllers are relatively slow and, furthermore, relatively inflexible.

It is an object of this invention to provide a controller which is substantially faster than prior art controllers.

It is another object of this invention to provide a controller to which functional elements, such as input/output devices, readily can be added.

It is yet another object of this invention to provide a controller which is relatively easy to use.

It is yet another object of this invention to provide a controller which is capable of controlling a multiplicity of compressors.

It is yet another object of this invention to provide a controller which can fill four storage vessels simultaneously with compressed natural gas.

SUMMARY OF THE INVENTION

In accordance with this invention, there is provided a controller comprised of a high speed central processing unit, at least about 32 analog input channels operatively connected to the central processing unit, at least about 48 digital input channels operatively connected to the central processing unit, at least about 32 digital output channels operatively connected to the central processing unit, at least 20 control input channels connected to the central processing unit, and display means for displaying graphical information connected to the central processing unit.

BRIEF DESCRIPTION OF THE DRAWINGS

The present invention will be more fully understood by reference to the following detailed description thereof, when read in conjunction with the attached drawings, wherein like reference numerals refer to like elements, and wherein:

FIGS. 8A, 8B, 8C, 8D, 8E, and 8F, are front views of the controller, the controller face panel, the controller back plane, the computer swing panel, the assembled controller, the assembled back plane, respectively, of the controller of FIG. 1;

DESCRIPTION OF THE PREFERRED EMBODIMENTS

Figure 1:
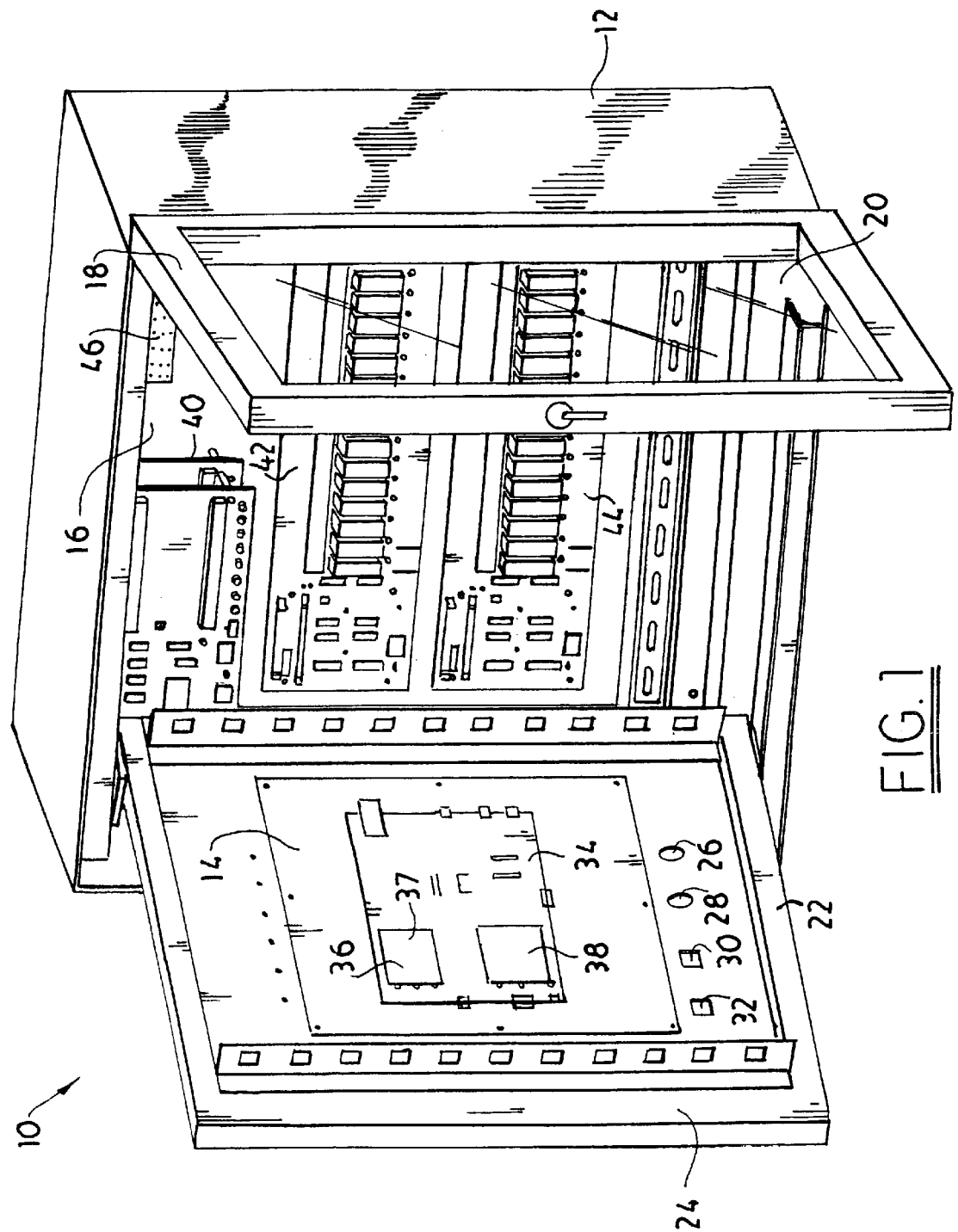
FIG. 1 is a perspective view of one preferred embodiment of the controller of the invention.

FIG. 1 is a perspective view of a controller 10, which is comprised of an enclosure 12, swing panel 14, and controller back plane assembly 16.

Enclosure 12 is preferably weatherproof and meets the standards of NEMA (National Electrical Manufacturers Association) for its NEMA 4 rating. Enclosure 12 is comprised of a front door 18 with a plexiglass window 20, a swing frame 22 on the interior surface 24 of which is mounted an emergency shutdown switch 26, a key lock switch 28, a reset pushbutton 30, a dial out pushbutton 32, and the computer swing panel 14. Mounted on computer swing panel 14 is main computer board (central processing unit) 34. The central processing unit 34 preferably comprises a modem 36, and a stacked digitial input/output assembly 38. On top of modem 36, in stacked relationship thereto, is multiplexing board 37.

Referring again to FIG. 1, back plane 16 assembly has mounted thereon stacked analog input board assembly 40, digitial output board 42, and digitial output board 44. Power supply 46 is preferably mounted in the upper right corner of backplane assembly 16.

As will be apparent to those skilled in the art, each of the elements listed above is readily commercially available. Thus, by means of illustration and not limitation, one may use the commercially available parts described below.

The enclosure 12 may be purchased as catalog number EL1920 from the Rittal Corporation of 1 Rittal Place, Springfield, Ohio. The main computer board 34 may be purchased as catalog number SBC386SX-25-2M from WinSystems, Inc. of 715 Stadium Drive, Arlington, Tex. The modem 36 may be purchased as catalog number PC9600 from Xecom, Inc. of 374 Turquoise Street, Milpitas, Calif. The multiplexing board 37 may be purchased as catalog number MPC500-1 from Micro/sys, Inc. of 3447 Ocean View Blvd., Glendale, Calif. The digital input/output assembly 38 is comprised of two boards; the first such board may be purchased as catalog number MPC132-INV from Micro/sys, Glendale, Calif. and the second such board may be purchased as catalog number PCMUIO48 from the aforementioned WinSystems company. Analog input board assembly 40 may be purchased as catalog number AIN16 from such Micro/sys company. Digital output boards 42 and 44 may be purchased as catalog number DPB16 from the Micro/sys company.

Figure 2:
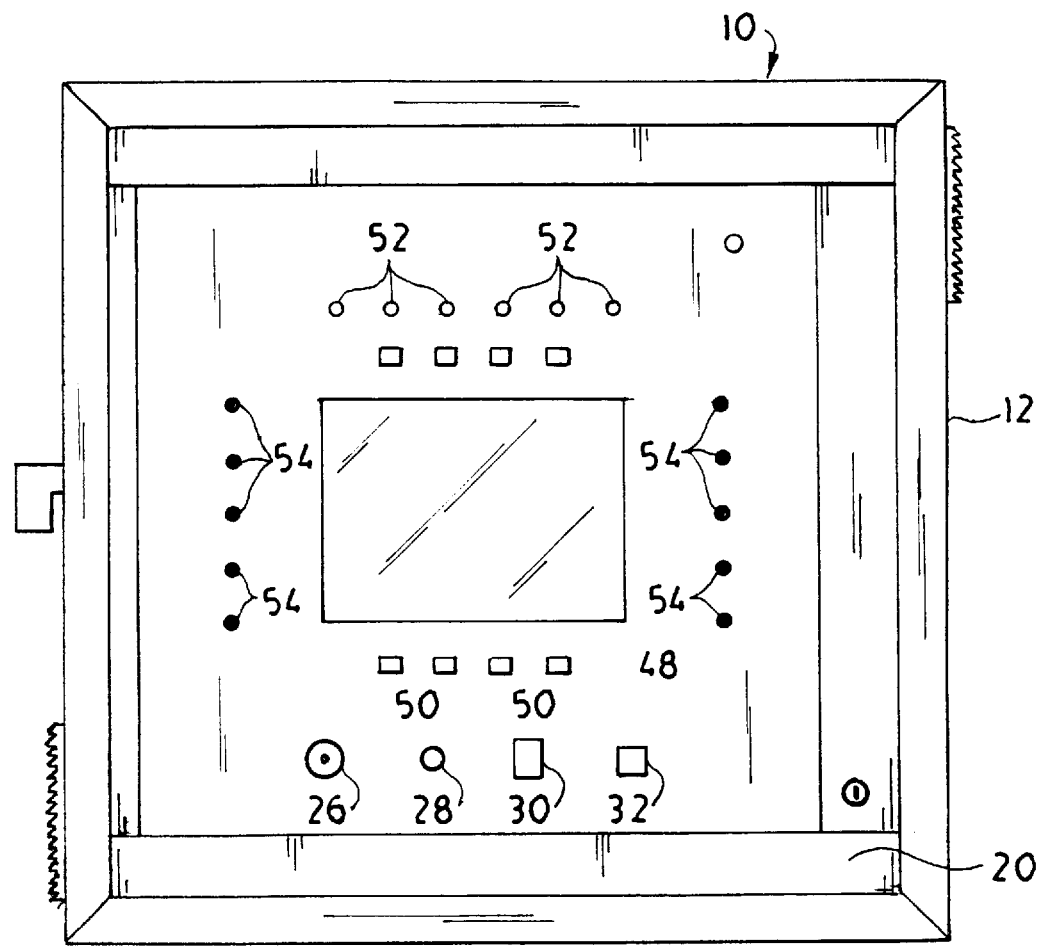
FIG. 2 is a front of the controller of FIG. 1.

FIG. 2 is a front view of controller 10. Referring to FIG. 2, it will be seen that substantially centrally disposed within controller 10 is display 48.

Display 48 is preferably an electroluminescent display. These electroluminescent displays are well known in the prior art and described, e.g., in U.S. Pat. Nos. 5,445,711, 5,416,494, 5,400,047, 5,304,895, 5,302,966, 5,239,227, 5,194,027, 5,179,312, 5,146,213, 5,133,036, and the like.

The disclosure of each of these U.S. Pat. is hereby incorporated by reference into this specification.

Electroluminescent displays are readily commercially available. Thus, by way of illustration and not limitation, one may use a display sold as catalog number EL7768MS by Planar Systems, Inc. of 1400 N.W. Compton Drive, Beaverton, Oreg.

It is preferred that display 48 be VGA feature connector compatible, i.e., it must be compatible with the standard VGA video card used in most IBM compatible computers.

It is also preferred that display 48 have a resolution of at least about 640+480 pixels.

Referring again to FIG. 2, disposed above and below display 48 are a multiplicity of pushbuttons 50 whose activation causes the display of different screens on display 48. A multiplicity of light emitting diodes 52 indicate various aspects of the systems status. Toggle switches 54 control various, diverse functions.

Figure 3:
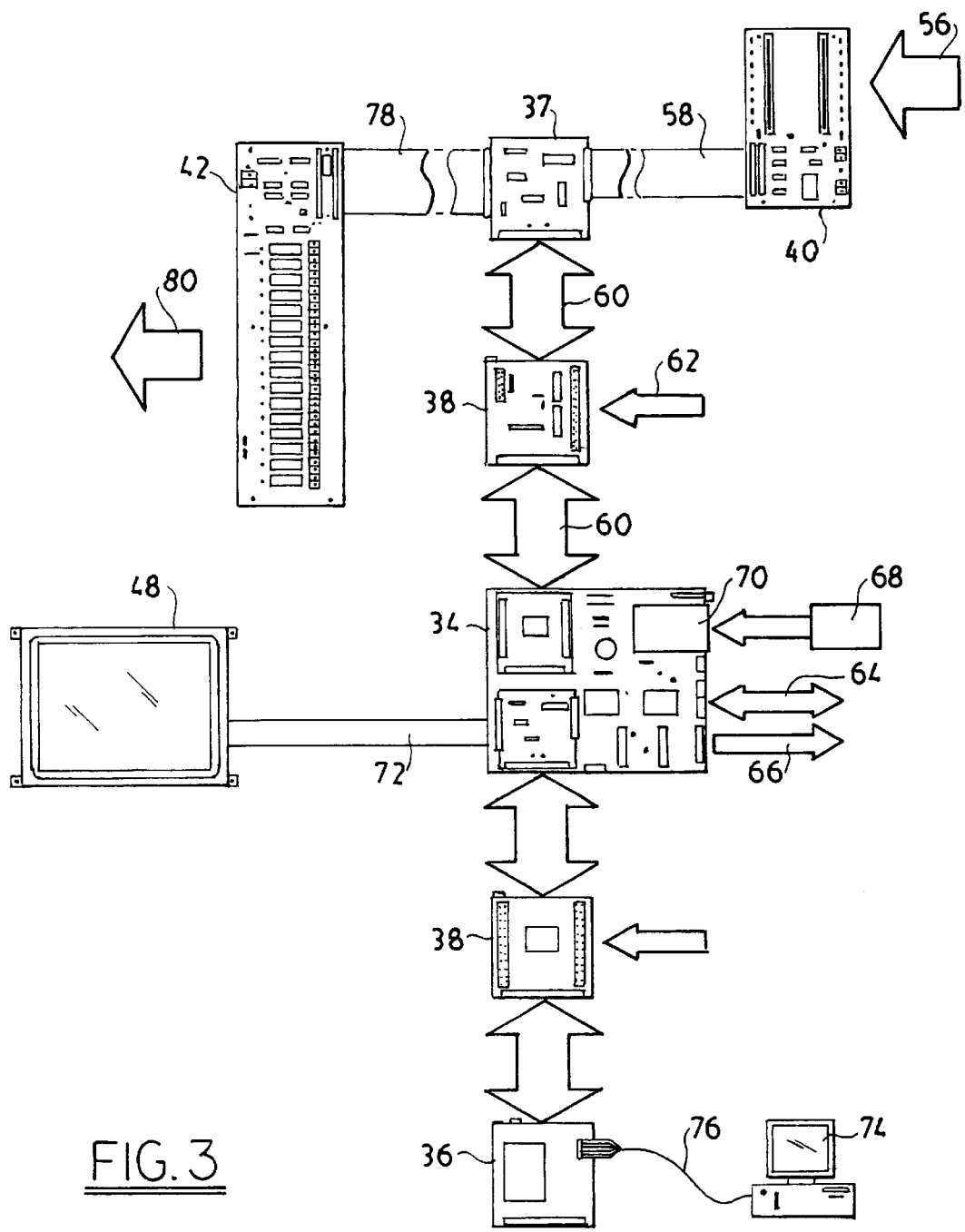
FIG. 3 is a block diagram illustrating the functional elements of the controller of FIG. 1.

FIG. 3 is a block diagram schematically illustrating the operation of controller 10.

Referring to FIG. 3, sensors (not shown) feed analog information via input 56 to analog input board assembly 40. In general, there are at least 32 separate inputs 56 inputting information in the form of voltage or current to at least two analog input boards 40, each of which preferably has at least 16 input channels; in a more preferred embodiment, at least about 4 such boards 40 are used, and in an even more preferred embodiment at least about 8 such boards 40 are used. As will be apparent to those skilled in the art, the input boards 40 may be stacked ("daisy chained") to simultaneously provide a multiplicity of outputs via cable 58. They thus provide the capability of handling the inputs from at least about 32 different sources.

Although it is preferred to have at least 32 separate inputs 56, it is even more preferred to have at least about 64 of such inputs 56 and, even more preferably, to have at least about 128 of such inputs 56.

Analog input assemblies 56 are well known to those skilled in the art and are described, e.g., in U.S. Pat. Nos. 5,428,752 (analog to digital inputs), 5,420,807 (multiplying analog inputs by digital data), 5,420,806 (controlling analog inputs), 5,414,310 (differential and single ended analog inputs), 5,410,269 (sample and hold circuitry), 5,396,442 (multiplying analog inputs by digital data), 5,396,131 (differential amplifiers), 5,392,039 (analog to digital converters), 5,389,926 (analog to digital converters), 5,369,407 (linear inputs), and the like. The disclosure of each of these United States patents is hereby incorporated by reference into this specification.

Referring again to FIG. 3, the information fed through inputs 56 to boards 40 is multiplexed and amplified and, thereafter, it is transmitted via ribbon cable 58 to multiplexing board 37, wherein the multiplicity of signals are assigned separate groups and channels and are processed.

Multiplexing assemblies, such as multiplexing board 37, are well known to those skilled in the art. Thus, e.g., reference may be found in the U.S. Pat. Nos. 5,432,793 (expander boards), 5,420,995 (multiplexing controller), 5,257,260 (multiplexing communication signals), 5,254,971 (multiplexing capacitors and switches), 5,235,317 (lamp monitoring), 5,223,820 (lamp monitoring), 5,185,071 (multiplexing disks), 5,172,377 (multiplexing for in circuit diagnostics), and the like. The disclosure of each of these United States patents is hereby incorporated by reference into this specification.

Referring again to FIG. 3, the output from multiplexing board 37 is fed via bus 60 to main computer board 34. Simultaneously, control inputs (not shown) are fed via line 62 into digital input/output assembly 38, which shares bus 60; and the output from assembly 38 is fed via bus 60 to main computer board 34.

In the preferred embodiment illustrated in FIG. 3, central processing unit 34 preferably must be at least as fast as an Intel 386 CPU, must have at least 2 megabytes of dynamic random access memory, must contain an on-board solid state disk array, must have an on board PCMCIA (personal computer memory card international association) slot, must have at least two serial ports configurable as either RS232 or RS485, must have at least one parallel port, must have a keyboard controller, must have an on board VGA compatible video controller, must have fixed and floppy disk controllers, and must have an on board real time clock and watchdog timer.

Referring again to FIG. 3, it will be seen that data may be fed to or from central processing unit 34 via serial lines 64 and/or parallel lines 66. In the embodiment depicted, a PCMCIA card 68 is shown being inserted into PCMCIA slot 70.

The output from central processing unit 34 is fed via ribbon cable 72 to display 48, where it may be suitably displayed depending upon the display sought.

In the embodiment depicted in FIG. 3, it will be seen that a remote personal computer may be connected via telephone line 76 to modem 36 and thence to central processing unit 34.

The outputs from central processing unit 34 may be fed through bus 60 through multiplexing board 37 through ribbon cable 78 to digital output board 42. The output from digital output board 42 may be fed through lines 80 to the device or devices to be controlled.

Figure 4:
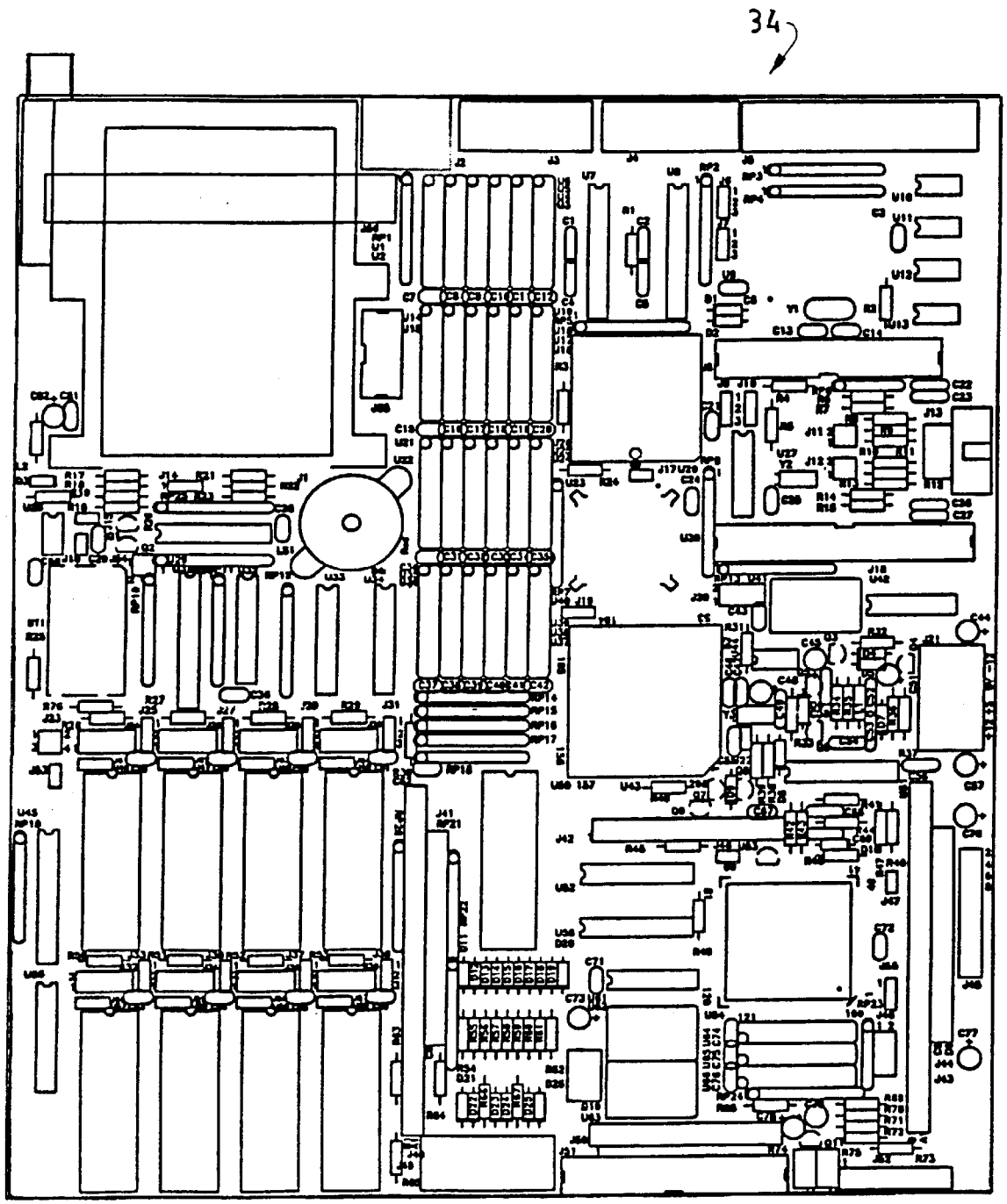
FIG. 4 is a top view of the central processing unit of the controller of FIG. 1.

FIG. 4 is a top view of the main computer board 34 which, in the embodiment depicted, is sold by the aforementioned WinSystems company as part number SBC386SX-25-2M.

Figure 5:
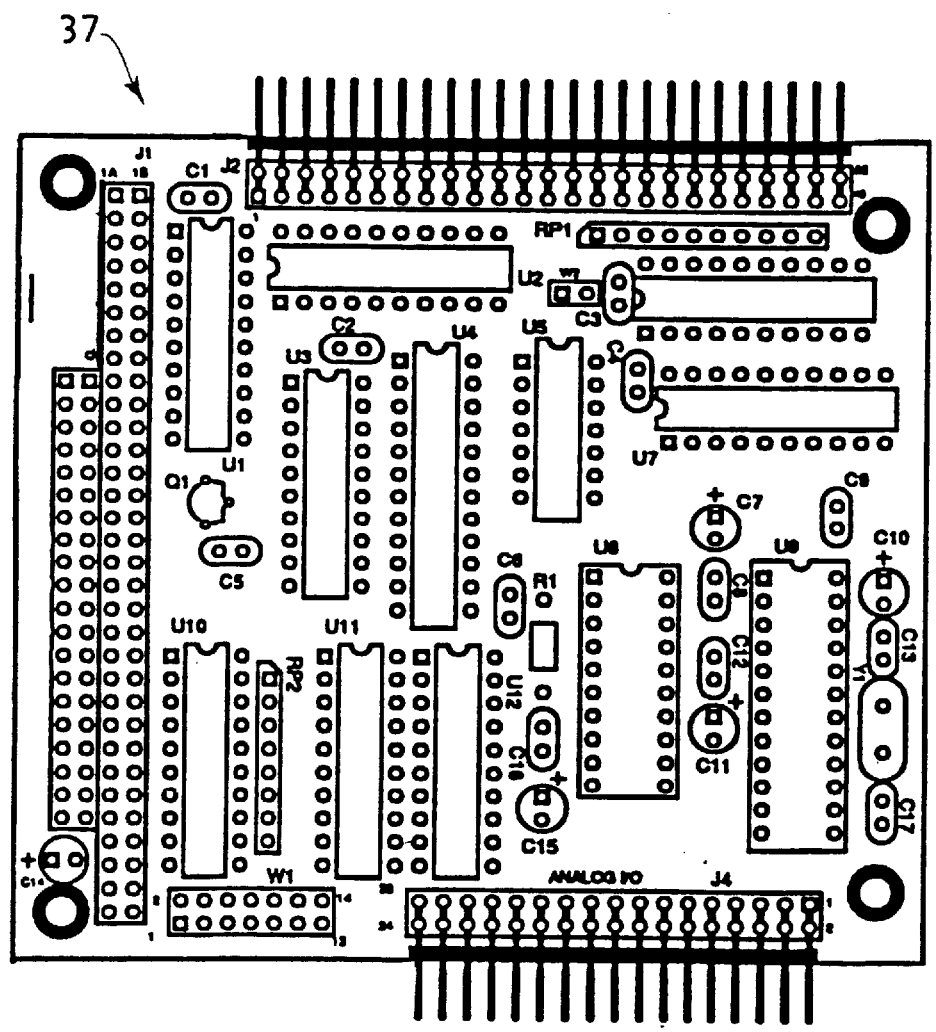
FIG. 5 is a top view a multiplexing assembly of the controller of FIG. 1.

FIG. 5 is a top view of the multiplexing board 37, which, in the embodiment depicted, is sold by the aforementioned Micro/sys company as part number MPC500-1.

Figure 6:
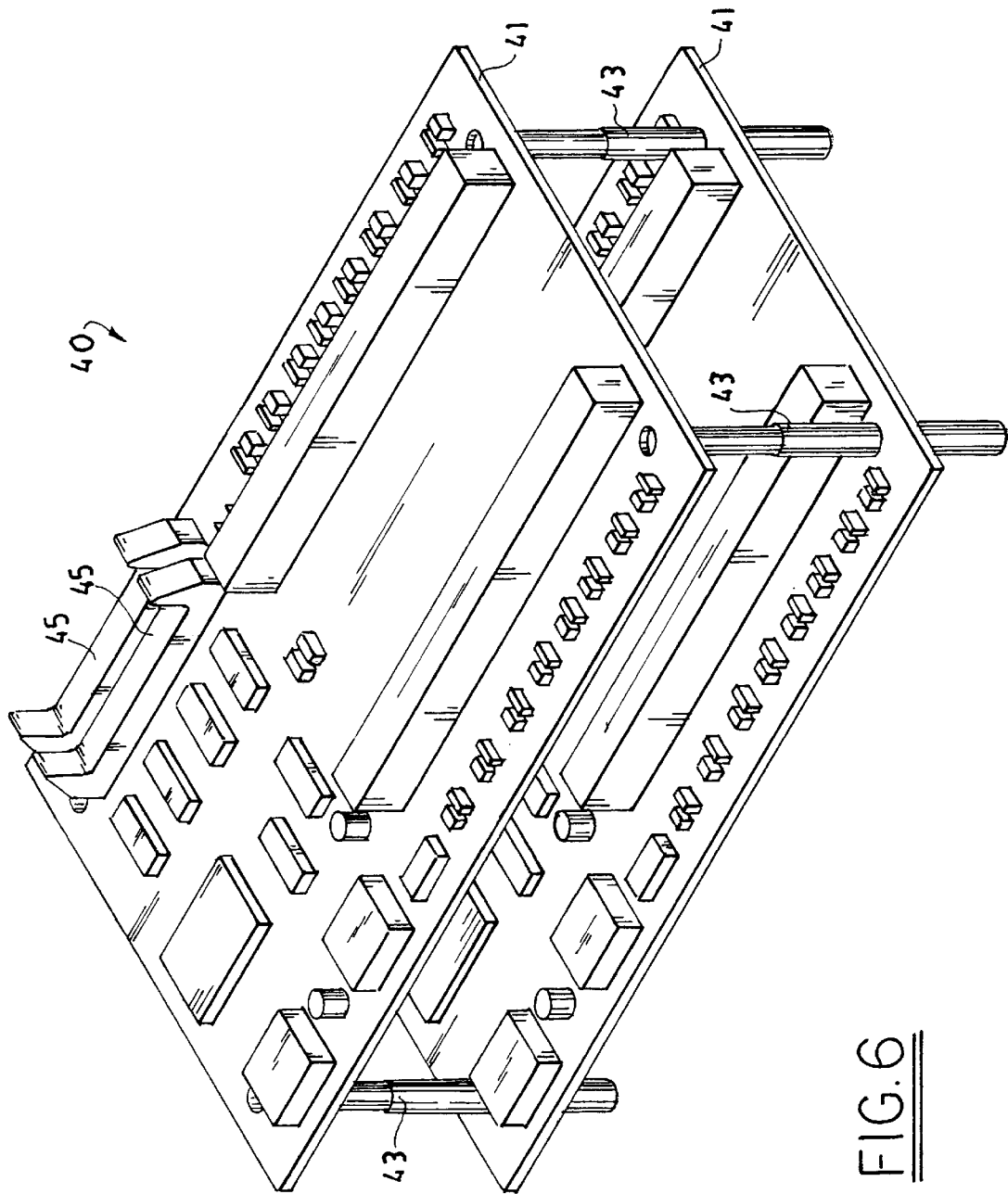
FIG. 6 is a perspective view of a stacked analog input board assembly.

FIG. 6 is a perspective view of the stacked analog input board assembly 40 which, in the embodiment depicted, is comprised of two analog input boards 41 which are mechanically connected together by standoff assemblies 43. As will be apparent to those skilled in the art, in spite of such mechanical connection, boards 41 are electrically connected to each other in a "daisy chain" fashion by ribbon connector 45.

In the embodiment depicted in FIG. 6, two boards 41 are daisy chained together to form the analog input board assembly 40. In another embodiment, not shown, four such boards 41 are daisy chained together. In yet another embodiment, not shown, eight such boards 41 are daisy chained together.

Figure 7:
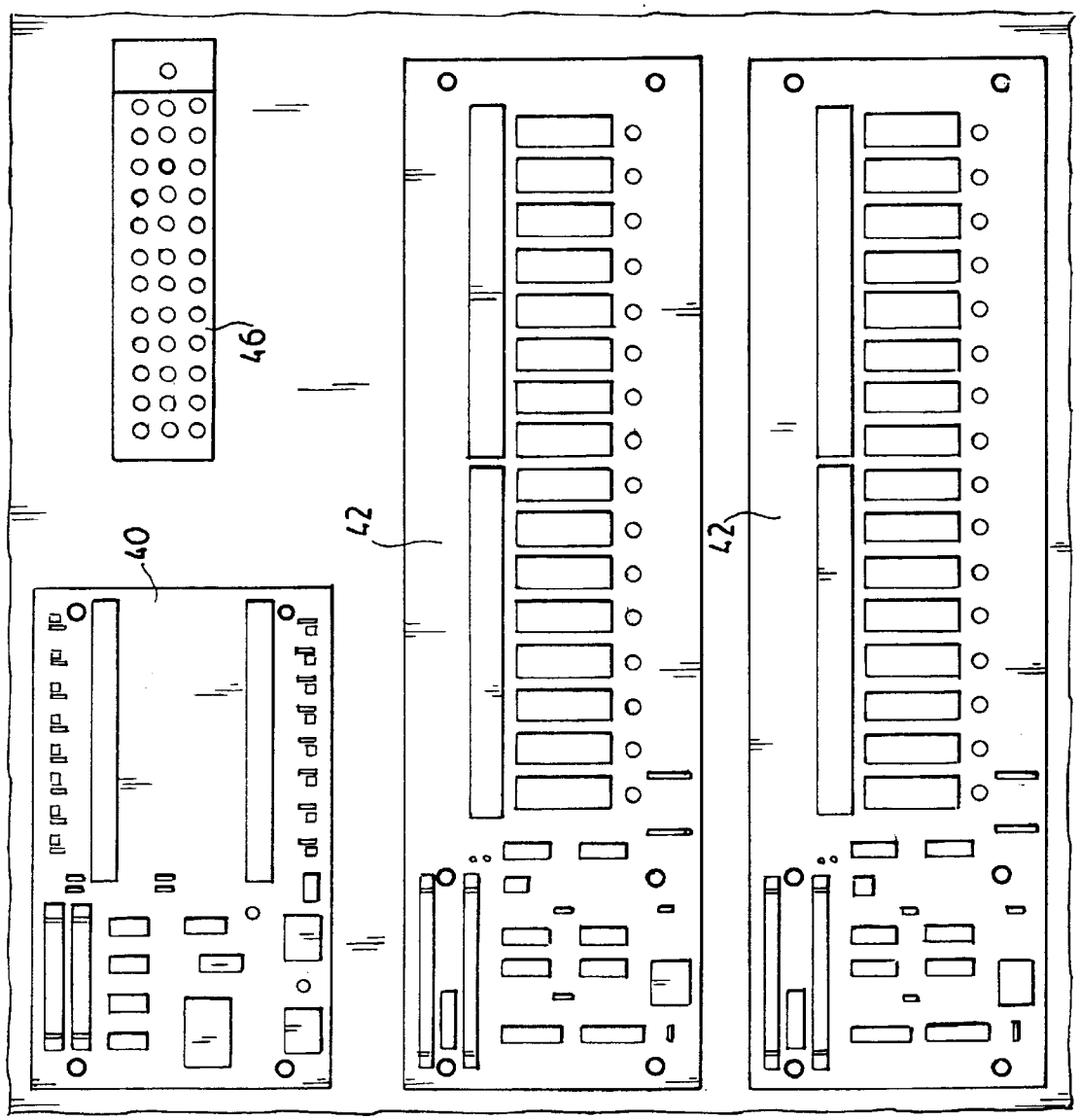
FIG. 7 is a front view of the controller back plane of the controller of FIG. 1.

FIG. 7 is a front view of back plane assembly 16 showing, mounted thereon, analog input board assembly 40, digital output boards 42, and power supply 46.

FIG. 8A is a front view of controller 10. FIG. 8B is a front view of controller face panel 21 which is preferably mounted on swing frame 22; it comprises a cut out 23 for display 48. FIG. 8C is a front view of panel 17 for the back plane containing hole patterns for the mounting of the components shown in FIG. 8F. FIG. 8D is a front view of the computer swing panel 14.

Figure 9:
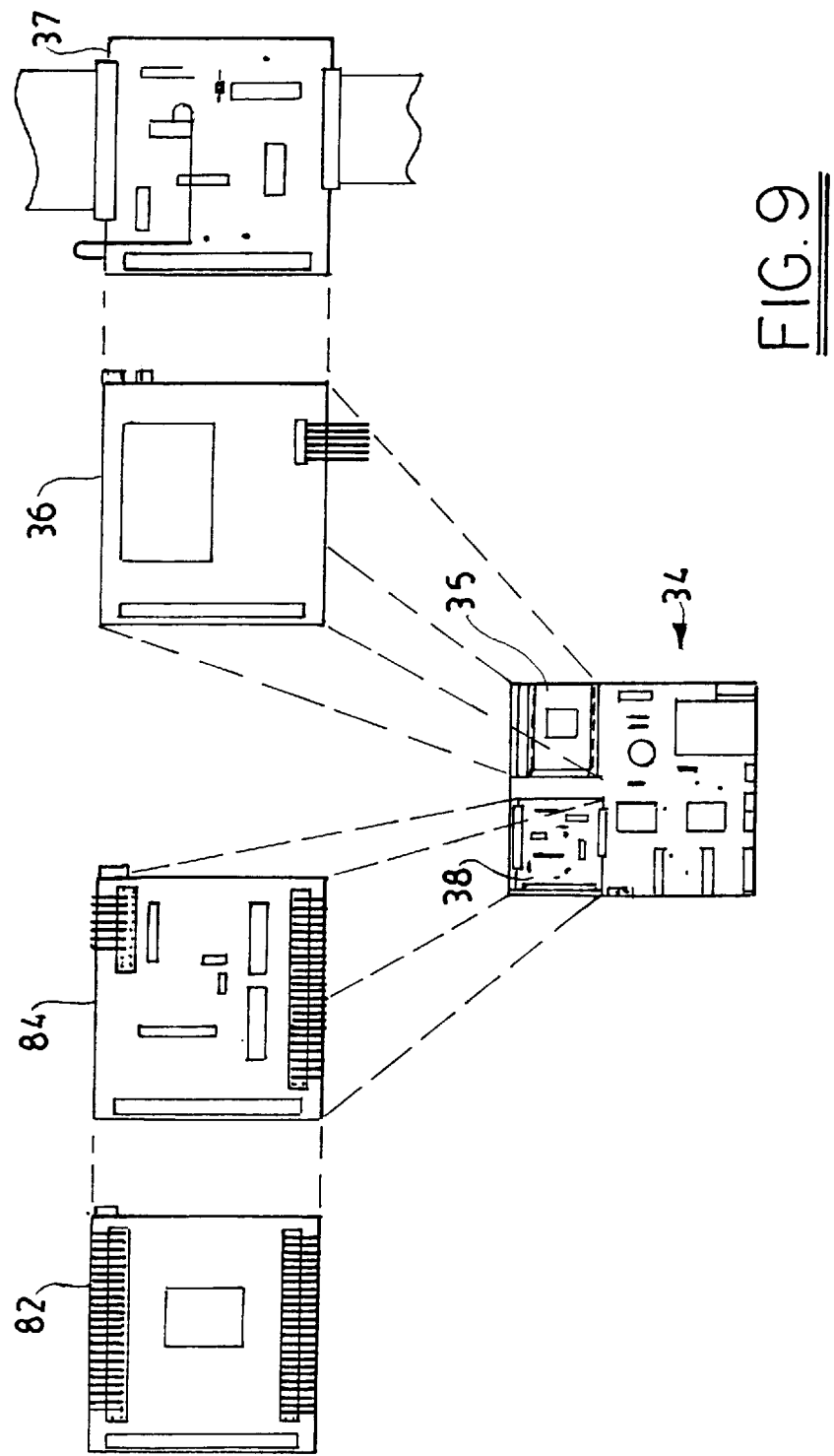
FIG. 9 is an exploded view of the main board assembly of the controller of FIG. 1.

FIG. 9 is an exploded view of showing the location of various boards upon main computer board. Referring to FIG. 9, multiplexing board 37 is stacked onto modem 36, and the stacked assembly 35 is disposed in the location indicated.

Referring again to FIG. 9, digital input/output boards 82 and 84 are stacked together to form digital input/output assembly 38. Board 82 may be, e.g., part number PCM-UIO48 purchased from the WinSystems company, and board 84 may be, e.g., catalog number MPC132-INV, purchased from Micro/sys company.

Figure 10:
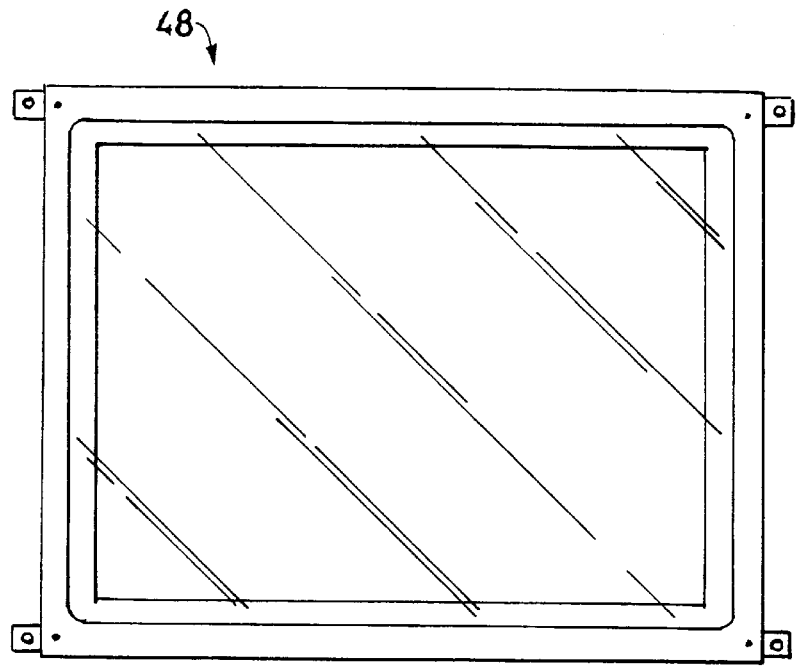
FIGS. 10 and 11 are front and back views, respectively, of the graphics display assembly of the controller of FIG. 1.
Figure 11:
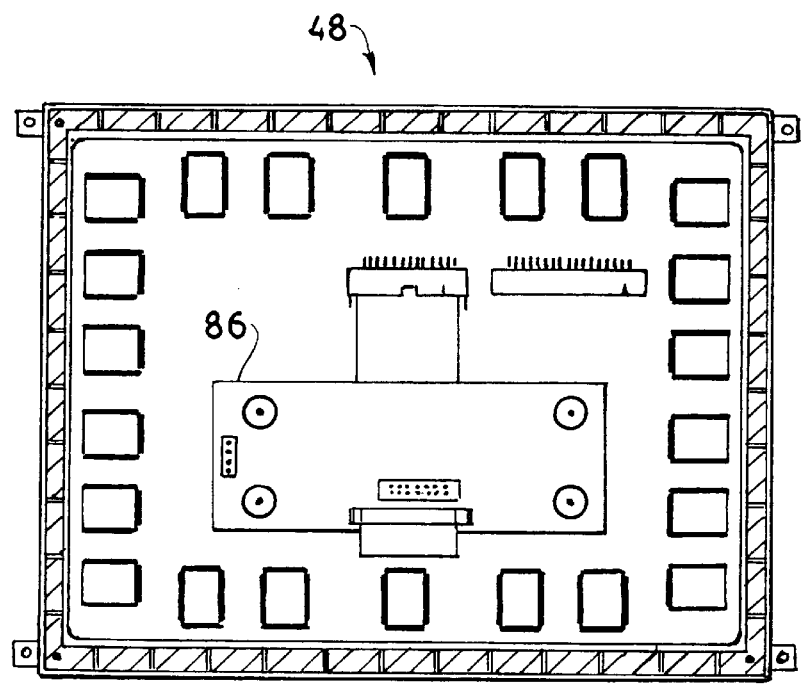

FIG. 10 is a front view of display 48. FIG. 11 is a back view of display 48. Referring to FIG. 11, it will be seen that, in the preferred embodiment depicted, mounted on the back of display is a display power supply 86.

A preferred process of the invention

Controller 10, because of its unique combination of properties, allows one to engage in many heretofore unattainable process steps with a single controller. Some of these process steps are described.

Figure 12:
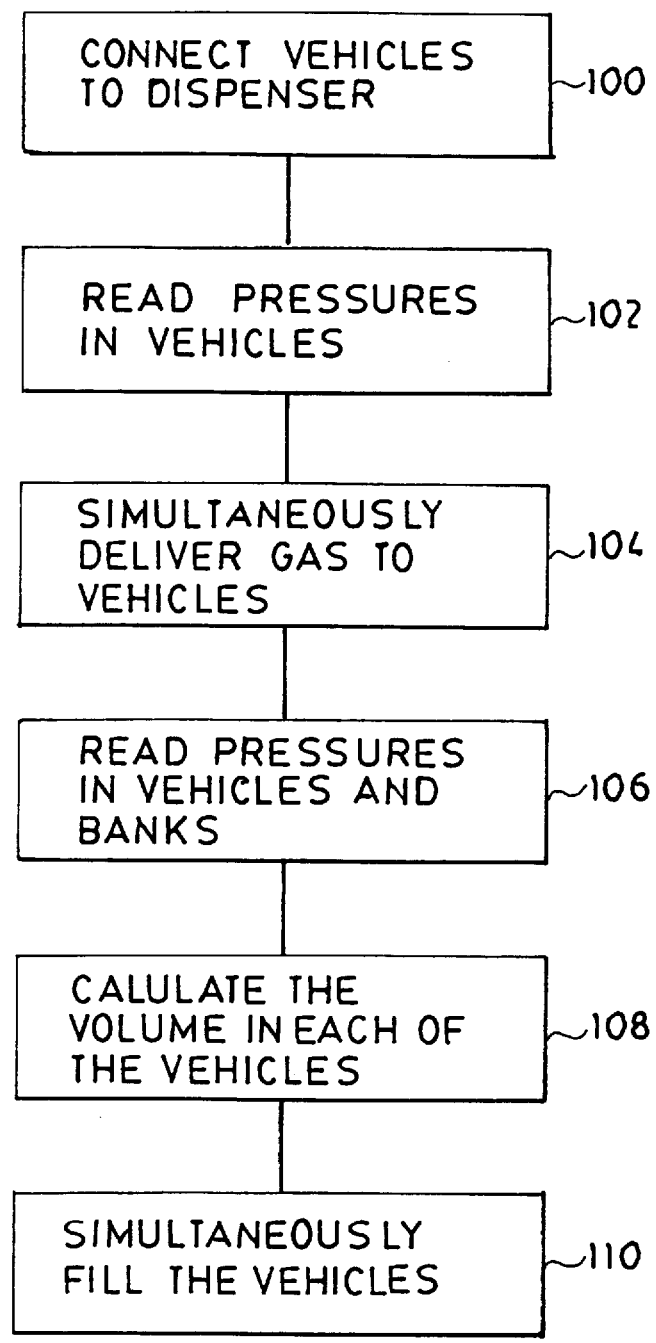
FIG. 12 is a flow chart of a preferred process of the invention.

FIG. 12 is a flow diagram of one such preferred process.

In the first step of the process, step 100, three or more vehicles or storage vessels are connected to a dispensing system connected to one controller 10. As used in the claims, the term "storage vessel" includes either a vehicle or a storage vessel. Each of these vehicles or vessels will have a certain pressure in them which may be greater than, less than, or the same as the pressures in a multiplicity of storage banks used in the process.

Thereafter, in step 102, the pressures in each of the three or more vehicles or storage vessels are simultaneously read by the one controller 10; and the pressures in each of three or more storage banks also read. To the extent that the pressure in any one storage bank is greater than the pressure in any one vehicle, gas will flow from such bank to such vehicle.

Thereafter, in step 104, natural gas is simultaneously delivered to the three or more vehicles or vessels from a multiplicity of storage banks (not shown) and/or one or more compressors. To the extent that the pressure in any one storage bank is insufficient to fill a vehicle with gas, such vehicle may be filled with a compressor.

The extent to which the vehicles are filled from the storage banks will depend upon the pressure differentials between the storage banks and the vehicles. After the vehicles have had gas delivered to them in step 104, the controller 10 reads the resulting pressures in the storage banks and the vehicles.

Thereafter, in step 108, the controller 10 calculates the extent to which each of the vehicles or storage vessels is empty and, additionally, the pressure and volume of gas needed to be furnished to such vehicles or storage vessels to fill them. Thereafter, in step 110, the controller 10 delivers the required amount of gas from either the storage banks and/or the compressors to simultaneously fill the vehicles.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

We claim:

1. A controller especially adapted for controlling the flow of fluid in a multiplicity of compressors comprised of a central processing unit, at least about 32 analog input channels operatively connected to the central processing unit, at least about 48 digital input channels operatively connected to the central processing unit, at least about 32 digital output channels operatively connected to the central processing unit, at least 20 control input channels connected to the central processing unit, and electroluminescent display means for displaying graphical information connected to the central processing unit.

2. The controller as recited in claim 1, wherein said controller is disposed within a weatherproof enclosure.

3. The controller as recited in claim 1, wherein said electroluminescent display means is VGA feature connector compatible.

4. The controller as recited in claim 1, wherein said electroluminescent display means has a resolution of at least about 640×480 pixels.

5. The controller as recited in claim 1, wherein said controller comprises at least about 64 analog input channels operatively connected to said central processing unit.

6. The controller as recited in claim 1, wherein said controller comprises at least about 128 analog input channels operatively connected to said central processing unit.

7. The controller as recited in claim 1, wherein said controller is comprised of a multiplexing assembly.

8. The controller as recited in claim 1, wherein said central processing unit contains at least about 2 megabytes of dynamic random access memory.

9. The controller as recited in claim 1, wherein said central processing unit contains an on board, solid state disk array.

10. The controller as recited in claim 1, wherein said central processing unit contains an on board PCMCIA slot.

11. The controller as recited in claim 1, wherein said central processing unit contains at least two serial ports.

12. The controller as recited in claim 1, wherein said central processing unit contains at least one parallel port.

13. The controller as recited in claim 1, wherein said central processing unit contains a keyboard controller.

14. The controller as recited in claim 1, wherein said central processing unit has an on board VGA compatible video controller.

15. The controller as recited in claim 1, wherein said central processing unit is comprised of fixed and floppy disk controllers.

16. The controller as recited in claim 1, wherein said central processing unit is comprised of an on board real time clock.

17. The controller as recited in claim 1, wherein said central processing unit is comprised of a watchdog timer.

18. A process for filling at least three storage vessels, comprising the steps of sequentially:

(a) connecting at least three storage vessels to the controller of claim 1, (b) reading the pressures in each of said three storage vessels, (c) simultaneously delivering gas to each of said storage vessels, (d) determining the volume of gas present in each of said storage vessels, and (f) thereafter simultaneously delivering gas to each of said three storage vessels.

* * * * *